United States Patent [19]

Farago et al.

[11] Patent Number: 4,473,757
[45] Date of Patent: Sep. 25, 1984

[54] CIRCUIT MEANS FOR CONVERTING A BIPOLAR INPUT TO A UNIPOLAR OUTPUT

[75] Inventors: Jules C. Farago, San Jose; Andrew M. Wolff, Mountain View; David Bingham, Los Altos, all of Calif.

[73] Assignee: Intersil, Inc., Cupertino, Calif.

[21] Appl. No.: 328,518

[22] Filed: Dec. 8, 1981

[51] Int. Cl.³ .............................................. H01L 27/00
[52] U.S. Cl. ................................... 307/127; 307/151; 307/200 A; 363/127; 357/42
[58] Field of Search ............... 307/127, 128, 151, 581, 307/582, 583, 584, 585, 200 A, 255, 262; 323/311; 363/127; 357/42

[56] References Cited

U.S. PATENT DOCUMENTS

| | | | |
|---|---|---|---|
| 3,819,951 | 6/1974 | Moore | 307/255 X |
| 3,995,174 | 11/1976 | Zrudsky | 307/584 |
| 4,139,880 | 2/1979 | Ulmer et al. | 307/127 X |
| 4,303,958 | 12/1981 | Allgood | 357/42 |
| 4,319,144 | 3/1982 | King et al. | 363/127 |

Primary Examiner—E. A. Goldberg
Assistant Examiner—Derek Jennings
Attorney, Agent, or Firm—Spensley, Horn, Jubas & Lubitz

[57] ABSTRACT

A circuit which accepts an input signal of either positive or negative polarity and produces an output signal having an open circuit voltage similar in amplitude to the input signal amplitude but having a defined polarity. A plurality of switching elements, preferably MOS transistors, are connected in a bridge circuit, the bridge circuit having a pair of input terminals responsive to the input signal and a pair of output terminals for providing the output signal, the switching elements being connected between the input and output terminals. Each of the switching elements has a control input connected to one of the input terminals whereby each of the switching elements automatically opens or closes in response to the polarity of the input signal to maintain the defined polarity of the output signal.

2 Claims, 3 Drawing Figures

CIRCUIT MEANS FOR CONVERTING A BIPOLAR INPUT TO A UNIPOLAR OUTPUT

BACKGROUND OF THE INVENTION

1. Field of the Invention

The present invention relates to circuit means for converting a bipolar input to a unipolar output and, more particularly, to an active circuit that accepts an input signal of either positive or negative polarity and produces an output signal having an open circuit voltage similar in amplitude to the input signal amplitude but having a defined polarity.

2. Description of the Prior Art

The present invention is concerned generally with a circuit having a pair of input terminals responsive to an input signal and a pair of output terminals for providing an output signal, where it is desired that regardless of the polarity of the input signal applied to the input terminals, the output signal be similar in amplitude to the input signal and have a defined polarity.

It is obvious that such a circuit has a variety of applications. A primary application would be the protection of electronic components from damage due to the polarity of the power supply being reversed. For example, the inadvertent reversal of a battery in a handheld calculator or an electronic watch while the on/off switch is in the "on" position will often destroy the internal integrated circuits and other delicate electronic circuitry. Furthermore, the rapid discharge of the battery which would result may damage the battery or significantly shorten its life.

The most common circuit means for achieving the desired result is a bridge rectifier including four diodes connected between the input and output terminals. The primary drawback of a bridge rectifier is that the output voltage is always less than the input voltage. The exact amount of signal reduction is equal to two of the diodes forward blocking voltages. This is approximately 1.2 volts total for silicon diodes.

Another disadvantage of a silicon diode bridge rectifier is that it contains either individual diode chips or pairs of chips instead of a single chip containing all four diodes. Not being able to integrate all four diodes onto a single chip, due to the interaction between diodes which creates parasitic diodes, often causes increased production costs.

SUMMARY OF THE INVENTION

According to the present invention, there is provided a circuit that accepts an input signal of either positive or negative polarity and produces an output signal having an open circuit voltage which is similar in amplitude to the input signal amplitude but has a defined polarity. Such a circuit is useful in protecting electronic components from battery or power supply reversal. Furthermore, in many applications, such a circuit will not cause a significant reduction in the applied output voltage as would be the case with a bridge rectifier.

For many applications, the present invention would be a separate component in the system. On the other hand, it could readily be integrated onto a single monolithic integrated circuit containing additional functions without significantly increasing the cost thereof, making the present invention cost effective and an ideal solution for future integrated circuit designs.

Briefly, the present circuit means comprises a plurality of switch means connected in a bridge circuit, the bridge circuit having a pair of input terminals responsive to a bipolar input signal and a pair of output terminals for providing an output signal having a defined polarity, each of the switch means including a pair of terminals connected respectively to one of the input terminals and one of the output terminals and including a control terminal; and means connecting each of the control terminals to one of the input terminals for automatically opening or closing the switch means in response to the polarity of the input signal to maintain the defined polarity of the output signal.

A first one of the switch means is connected between one of the input terminals and one of the output terminals. A second one of the switch means is connected between the other one of the input terminals and the one output terminal. A third one of the switch means is connected to the one input terminal and the other output terminal. A fourth one of the switch means is connected between the other input terminal and the other output terminal. The control terminals of the first and third switch means are connected to the other input terminal and the control terminals of the second and fourth switch means are connected to the one input terminal. According to a preferred embodiment of the invention, each switch means comprises an active MOS transistor.

OBJECTS, FEATURES AND ADVANTAGES

It is an object of the present invention to solve the problems encountered heretofor in converting a bipolar input signal to a unipolar output signal having an open circuit voltage similar in amplitude to the input signal amplitude. It is a feature of the present invention to solve these problems by providing a new circuit which can be used either as a separate stand-alone component or which can be integrated onto a monolithic integrated circuit containing additional functions. An advantage to be derived is circuit which will not cause a significant reduction in the applied input voltage. A further advantage is a circuit which can be integrated onto a single monolithic integrated circuit. A still further advantage is a circuit which will prevent the inadvertent destruction of internal integrated circuits and other delicate electronic circuitry. Another advantage is a circuit which will prevent the rapid discharge of a battery. Still another advantage is a circuit which can be produced at an extremely low cost.

Still other objects, features, and attendant advantages of the present invention will become apparent to those skilled in the art from a reading of the following detailed description of the preferred embodiments constructed in accordance therewith, taken in conjunction with the accompanying drawings wherein like numerals designate like or corresponding parts in the several figures and wherein:

DESCRIPTION OF THE PREFERRED EMBODIMENTS

Figure 1:
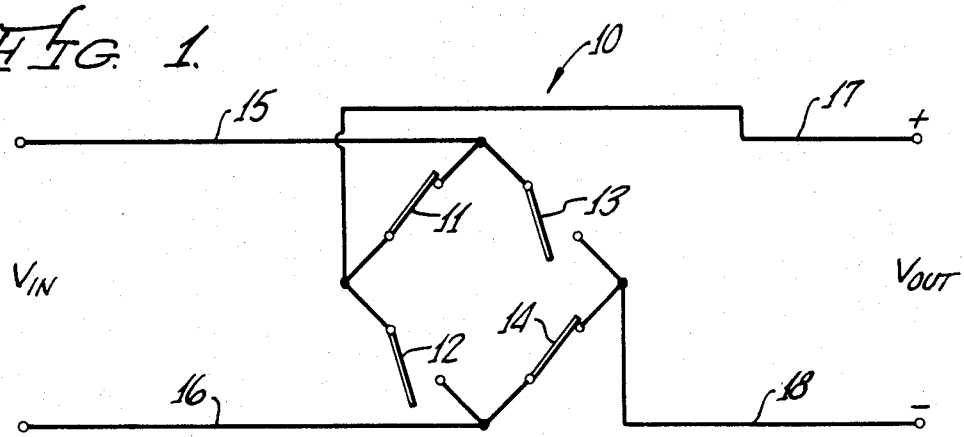
FIG. 1 is a highly simplified diagram of circuit means constructed in accordance with the teachings of the present invention.

Referring now to the drawings and, more particularly, to FIG. 1 thereof, there is shown an overly simplified version of circuit means, generally designated 10, constructed in accordance with the teachings of the present invention. From FIG. 1, it can be seen that circuit means 10 basically consists of four switches, generally designated 11–14, connected in a bridge configuration between a pair of input terminals 15 and 16 and a pair of output terminals 17 and 18. For a positive polarity input signal $V_{in}$ (input terminal 15 is positive and input terminal 16 is negative), switches 11 and 14 would be closed, as shown, connecting output terminal 17 to input terminal 15 and output terminal 18 to input terminal 16. At this time, switches 12 and 13 would be open, also as shown. In this manner, the output voltage $V_{out}$ will be equal to the input voltage $V_{in}$ and have the same polarity. If, on the other hand, the polarity of input signal $V_{in}$ is reversed so that input terminal 15 is negative and input terminal 16 is positive, switches 12 and 13 would be closed and switches 11 and 14 would be open. With this switch configuration, output terminal 17 is connected to input terminal 16 and output terminal 18 is connected to input terminal 15. The magnitude of output voltage $V_{out}$ will remain the same, as will the polarity. Accordingly, with such a simplified circuit, the output voltage polarity will remain coherent, i.e. output terminal 17 will always be biased positively with respect to output terminal 18.

According to the present invention, switches 11–14 are replaced by active semiconductor devices. While various active devices can be used, such as bipolar transistors, junction field-effect transistors and the like, in most applications, the characteristics of MOS transistors are preferable since the controlling gate is isolated from the other device terminals and thus draws no current and can be connected to a wide range of voltages. The present invention will, therefore, be described hereinafter with reference to MOS transistors.

Figure 2:
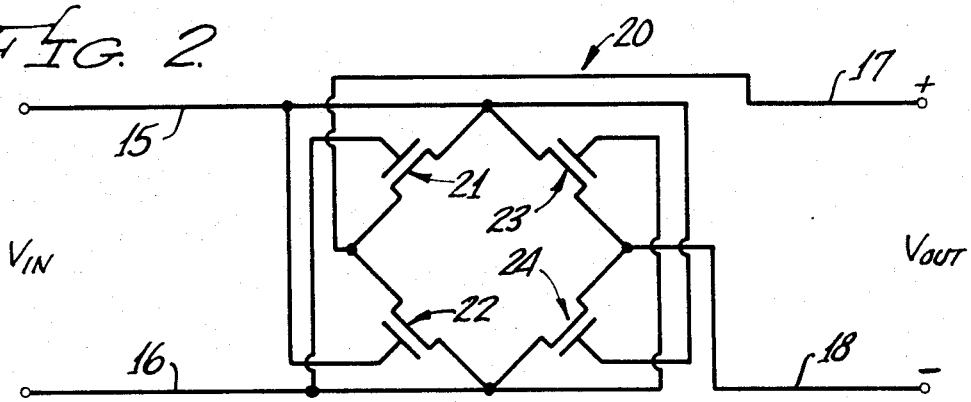
FIG. 2 is a more specific circuit diagram thereof.

Referring now to FIG. 2, there is shown circuit means, generally designated 20, which is similar to circuit means 10, except that switches 11–14 have been replaced by active MOS transistors, generally designated 21–24. The source and drain of transistor 21 are connected between input terminal 15 and output terminal 17, the source and drain of transistor 22 are connected between input terminal 16 and output terminal 17, the source and drain of transistor 23 are connected between input terminal 15 and output terminal 18, and the source and drain of transistor 24 are connected between input terminal 16 and output terminal 18. Each of transistors 21–24 has a gate, the gates of transistors 21 and 23 being connected to input terminal 16 and the gates of transistors 22 and 24 being connected to input terminal 15. In the example shown, transistors 21 and 22 are p-channel MOS transistors, while transistors 23 and 24 are n-channel MOS transistors.

In this initial simplification of circuit 20, it is assumed that the effect of the substrates of transistors 21–24 may be ignored and that transistors 21–24 are enhancement types such that no drain-to-source current can flow in any transistor with the gate thereof connected to its respective source. For current to be able to flow, the gates of the p-channel transistors must be biased slightly negatively with respect to their sources and for the n-channel transistors, the gates must be biased slightly positively with respect to their sources.

In operation, with an input voltage $V_{in}$ of greater than about +0.5 volts between input terminals 15 and 16, transistor 21 is turned or since its gate (which is connected to input terminal 16) is negatively biased with respect to its source (which is connected to input terminal 15). Thus, terminal 15 is connected to terminal 17. Similarly, transistor 24 connects input terminal 16 to output terminal 18 while transistors 22 and 23 are open. By reversing the polarity of $V_{in}$, it can be shown by similar reasoning that transistors 22 and 23 are closed and transistors 21 and 24 are open.

In reality, MOS transistors are truly four terminal devices, there beng a substrate gate in addition to the regular metal (or silicon) top-side gate. In some instances, it may be possible to leave the substrate gate as an open circuit, as in the case of silicon-on-sapphire (SOS) technologies. However, using regular junction, isolated, complementary MOS technologies (CMOS), it is not possible to ignore the substrate gates since in integrated structures, substrates may be common to more than one transistor.

In CMOS technologies, where both p- and n-channel transistors can be integrated onto a single chip, in most instances, it is necessary to have circuitry that detects polarities between the substrates and the transistor drain/sources (drain and sources are often symmetrical and interchangeable) and connects the substrates to sources so that the intrinsic pn diodes formed by the sources and substrates are not forward-biased. If a source-substrate diode is forward-biased, operation of the MOS transistor is modified and, furthermore, the characteristics of adjacent MOS transistors may also be modified (through minority carrier injection into the substrate caused by the forward-biasing of a source-to-substrate pn diode).

Figure 3:
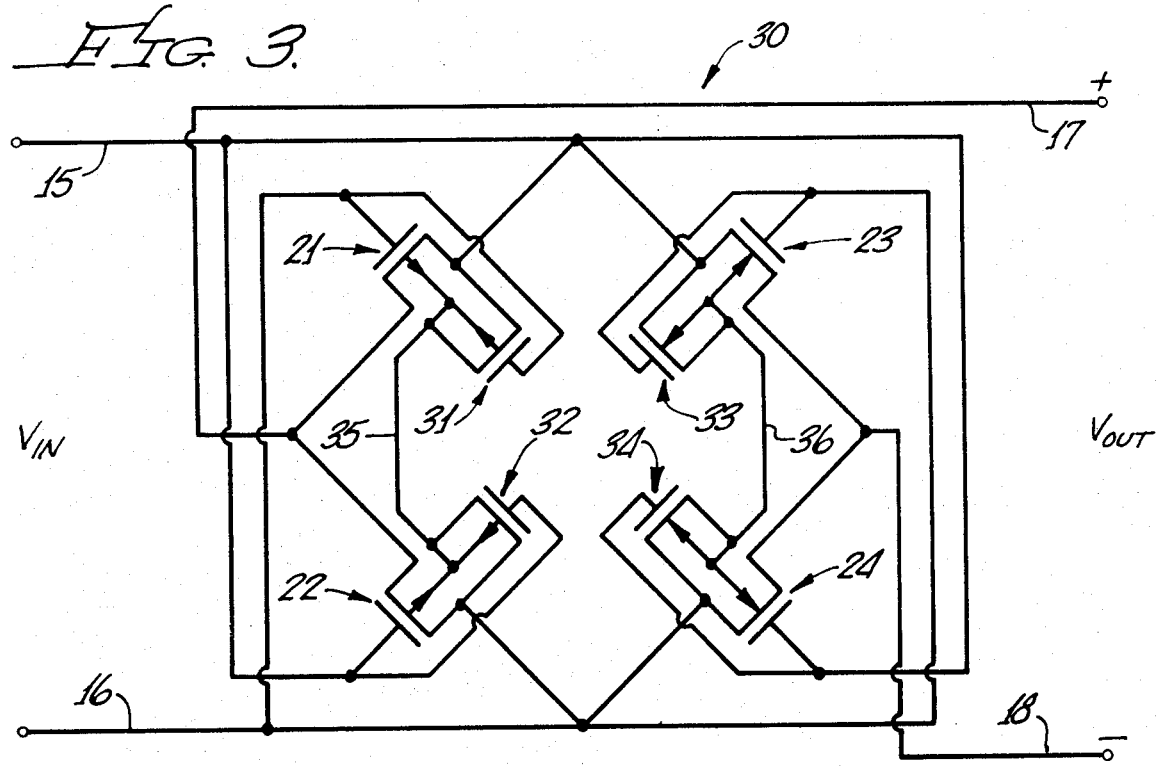
FIG. 3 is a still more specific circuit diagram thereof.

In order to eliminate this problem, circuit means 20 is modified, as shown in FIG. 3, to provide circuit means 30 including four extra transistors, generally designated 31–34, which are used solely to steer the substrate connections of all transistors to the correct points so that substrate-to-source diodes are not forward-biased. Referring now to FIG. 3, transistors 21, 31, 22 and 32 are all p-channel transistors, all of the substrates thereof being connected together at 35. Transistors 23, 33, 24 and 34 are all n-channel transistors, the substrates of which are all connected together at 36. Transistors 31–34 are connected across transistors 21–24, respectively, as shown, and are used solely to sense the polarity of the input voltage and to connect the two common substrate points 35 and 36 to either terminal 15 or 16, so that under all circumstances, points 35 and 36 will be respectively connected to the positive and negative terminals of the steering network.

In operation, assume a voltage applied to terminal 15 which is at least a few tenths of a volt more positive than the voltage applied to terminal 16. Under such circumstances, transistors 21, 31, 24 and 34 will be turned on and transistors 22, 32, 23 and 33 will be turned off. Transistor 31 will connect the common p-channel substrate point 35 to input terminal 15 and transistor 34 will connect the common n-channel substrate point 36 to input terminal 16. Thus, under all circumstances, the substrates will be connected to the positive (p-channel substrates) or negative (n-channel substrates) voltage points. The operation of transistors 21–24 is as described previously.

In practice, of course, transistors 21–24 are not ideal switches. Depending on the transistor configuration and sizes, each will have a finite on resistance (approximately inversely proportional to the input voltage for low-threshold transistors) and will have breakdown voltages which may range from a few volts to a few tens of volts. Transistors 31-34 will often be much smaller than transistors 21-24, since they do not have to carry large continuous currents.

It can therefore be seen that according to the present invention, there is provided circuit means that accepts an input signal of either positive or negative polarity and produces an output signal having an open circuit voltage which is similar in amplitude to the input signal amplitude but has a defined polarity. Such a circuit is useful in protecting electronic components from battery or power supply reversal. Furthermore, in many applications, such a circuit would not cause a significant reduction in the applied output voltage as would be the case with a bridge rectifier.

For many applications, the present invention would be a separate component in the system. On the other hand, it could readily be integrated onto a single monolithic integrated circuit containing additional functions without significantly increasing the cost thereof, making the present invention cost effective and an ideal solution for future integrated circuit designs.

While the invention has been described with respect to the preferred physical embodiments constructed in accordance therewith, it will be apparent to those skilled in the art that various modifications and improvements may be made without departing from the scope and spirit of the invention. Accordingly, it is to be understood that the invention is not to be limited by the specific illustrative embodiments, but only by the scope of the appended claims.

We claim:

1. Circuit means responsive to an input signal of either positive or negative polarity for producing an output signal of given polarity comprising:
   a plurality of switch means connected in a bridge circuit, said bridge circuit having a pair of input terminals connected to receive said input signal and a pair of output terminals for providing said output signal, said switch means being connected between said input and output terminals;
   each of said switch means comprising at least one MOS field effect transistor including a substrate, a gate electrode, a source and a drain;
   each of said gate electrodes being connected to a single input terminal;
   wherein first and second transistors connected between one of said output terminals and different input terminals are p-channel transistors, wherein third and fourth transistors connected between the other of said output terminals and different input terminals are n-channel transistors, wherein the gate electrodes of the transistors connected between one of said input terminals and different output terminals are connected to the other of said input terminals, and wherein the gate electrodes of the transistors connected between said other of said input terminals and different output terminals are connected to said one of said input terminals, whereby each of said transistors opens or closes in response to the polarity of said input signal to maintain said given polarity of said output signal; and
   means operatively connected between said input terminals and the substrates of said transistors and responsive to the polarity of said input signal for connecting said substrates to one or the other of said input terminals to insure that the intrinsic pn diodes formed by said substrates and said drains or sources respectively are not forward-biased, said means comprising:
   fifth, sixth, seventh and eighth transistors connected to said first, second, third and fourth transistors, respectively, said fifth and sixth transistors being p-channel transistors and said seventh and eighth transistors being n-channel transistors, all of the substrates of said p-channel transistors being connected together and all of the substrates of said n-channel transistors being connected together, the gate electrodes of said fifth and seventh transistors being connected to said other input terminal and said gate electrodes of said sixth and eighth transistors being connected to said one input terminal, said fifth through eighth transistors being responsive to the polarity of said input signal to connect the two common substrate connections to either said one input terminal or said other input terminal so that substrate-to-drain or substrate-to-source diodes are not forward-biased.

2. Circuit means comprising:
   a plurality of MOS field effect transistors connected in a bridge circuit, said bridge circuit having a pair of input terminals and a pair of output terminals, said input terminals being connected to receive an input signal of bipolar polarity for providing an output signal of a given polarity on said output terminals;
   each of said transistors including a pair of terminals connected respectively to one of said input terminals and one of said output terminals and including a gate electrode and a substrate;
   means connecting each of said gate electrodes to a single input terminal for automatically opening or closing said transistors in response to the polarity of said input signal;
   wherein first and second transistors connected between one of said output terminals and different input terminals are p-channel transistors, wherein third and fourth transistors connected between the other of said output terminals and different input terminals are n-channel transistors, wherein the gate electrodes of the transistors connected between one of said input terminals and different output terminals are connected to the other of said input terminals, and wherein the gate electrodes of the transistors connected between said other of said input terminals and different output terminals are connected to said one of said input terminals; and
   means operatively connected between said input terminals and the substrates of said transistors and responsive to the polarity of said input signal for connecting said substrates to one or the other of said input terminals, said means comprising:
   fifth, sixth, seventh and eighth transistors connected to said first, second, third and fourth transistors, respectively, said fifth and sixth transistors being p-channel transistors and said seventh and eighth transistors being n-channel transistors, all of the substrates of said p-channel transistors being connected together and all of the substrates of said n-channel transistors being connected together, the gate electrodes of said fifth and seventh transistors being connected to said other input terminal and said gate electrodes of said sixth and eighth transistors being connected to said one input terminal, said fifth through eighth transistors being responsive to the polarity of said input signal to connect the two common substrate connections to either said one input terminal or said other input terminal so that substrate-to-drain or substrate-to-source diodes are not forward-biased;

whereby said bridge circuit is responsive to said input signal of bipolar polarity for providing an output signal of said given polarity, and said operative connecting means are responsive to said input signal for insuring that the intrinsic substrate-to-drain or substrate-to-source diodes are not forward-biased.

* * * * *